United States Patent
Wiessneth

(10) Patent No.: US 9,209,554 B2
(45) Date of Patent: Dec. 8, 2015

(54) HOUSING FOR AN ELECTRONIC CIRCUIT

(75) Inventor: Ernst Wiessneth, Monheim (DE)

(73) Assignee: IFM ELECTRONIC GMBH, Essen (DE)

( * ) Notice: Subject to any disclaimer, the term of this patent is extended or adjusted under 35 U.S.C. 154(b) by 1 day.

(21) Appl. No.: 13/807,019

(22) PCT Filed: Jun. 29, 2011

(86) PCT No.: PCT/EP2011/060918
§ 371 (c)(1),
(2), (4) Date: Dec. 27, 2012

(87) PCT Pub. No.: WO2012/001049
PCT Pub. Date: Jan. 5, 2012

(65) Prior Publication Data
US 2013/0109209 A1    May 2, 2013

(30) Foreign Application Priority Data

Jun. 30, 2010  (DE) .......................... 10 2010 030 728
Oct. 11, 2010  (DE) .......................... 10 2010 042 254

(51) Int. Cl.
| | | |
|---|---|---|
| *H01R 13/533* | (2006.01) | |
| *H05K 5/00* | (2006.01) | |
| *H05K 5/02* | (2006.01) | |

(52) U.S. Cl.
CPC ............ *H01R 13/533* (2013.01); *H05K 5/0026* (2013.01); *H05K 5/0213* (2013.01)

(58) Field of Classification Search
CPC ... H01R 13/533; H05K 5/0026; H05K 5/0213
USPC .................................. 174/50, 50.57; 361/813
See application file for complete search history.

(56) References Cited

U.S. PATENT DOCUMENTS

| | | | |
|---|---|---|---|
| 5,422,791 A | | 6/1995 | Bentz et al. |
| 5,650,591 A | * | 7/1997 | Matsushita et al. ....... 174/17 VA |

FOREIGN PATENT DOCUMENTS

| | | |
|---|---|---|
| DE | 4140487 A1 | 6/1993 |
| DE | 102006053114 A1 | 5/2008 |
| DE | 102007035094 A1 | 1/2009 |
| EP | 0484288 A1 | 5/1992 |
| EP | 1527956 A1 | 5/2005 |

OTHER PUBLICATIONS

European Patent Office, International Search Report in International Patent Application No. PCT/EP2011/060918 (Nov. 22, 2011).

* cited by examiner

*Primary Examiner* — Jenny L Wagner
*Assistant Examiner* — Michael E Moats, Jr.
(74) *Attorney, Agent, or Firm* — Leydig, Voit & Mayer, Ltd.

(57) ABSTRACT

A housing for an electronic circuit includes a plug-housing part having an electric plug connector and a venting channel. A web is shaped onto an inside of the plug-housing part so as to delimit an installation area. A pressure equalizing element is disposed in the installation area below the venting channel and glued to the inside of the plug-housing part. The plug-housing part includes, in the installation area, a venting cutout having a first cross section disposed between the pressure equalizing element and a first venting channel. The first venting channel has a second cross section that is smaller than the first cross section and opens up into a second venting channel that runs essentially perpendicular to the first venting channel. The second venting channel is disposed inside a housing projection on an outside of the plug-housing part and has, at each axial end, an opening to the outside.

4 Claims, 2 Drawing Sheets

HOUSING FOR AN ELECTRONIC CIRCUIT

CROSS-REFERENCE TO PRIOR APPLICATIONS

This application is a U.S. National Phase application under 35 U.S.C. §371 of International Application No. PCT/EP2011/060918, filed on Jun. 29, 2011, and claims benefit to German Patent Application Nos. DE 10 2010 030 728.9, filed on Jun. 30, 2010, and DE 10 2010 042 254.1, filed on Oct. 11, 2010. The International Application was published in German on Jan. 5, 2012 as WO 2012/001049 under PCT Article 21(2).

FIELD

The invention relates to a housing for an electronic circuit having a pressure equalizing element on the inside of a housing part.

BACKGROUND

Housings for electric circuits are quite familiar from the state of the art. Particularly in the automotive realm, electronic control circuits are protected by means of a control-unit housing. These control units are especially employed in the engine compartment, where they are exposed to considerable temperature fluctuations that can lead to major pressure fluctuations inside the housing. In order to compensate for these pressure fluctuations, in a simple case, all that is needed is to make drilled holes or openings through which the pressure differentials can be equalized. A drawback of these approaches is that an exposed opening can also allow water to get directly into the housing, where it can cause damage. In order to prevent water from penetrating directly into the housing, it is a known procedure from the state of the art to employ so-called semi-permeable membranes that are arranged over a venting opening and that allow air as well as water vapor to enter or exit through the membrane, whereas water in liquid form is not allowed to pass through.

It is already a known procedure from German patent application DE 41 40 487 A1 to use a control unit or switching device in which a pressure equalizing element is injection-molded into a cutout of a plug strip in the body of the housing. The venting to the outside takes place here through several drilled holes offset with respect to each other.

Moreover, German patent application DE 10 2007 035 094 A1 discloses a housing for an electric circuit that has an electric plug connector and a pressure equalizing element that is covered by a protection element or a cover hood. Here, at least one pressure equalizing opening of the protective cap is oriented in the direction of a plug connector.

SUMMARY

In an embodiment, the present invention provides a housing for an electronic circuit including a plug-housing part having an electric plug connector and a venting channel. A web is shaped onto an inside of the plug-housing part so as to delimit an installation area. A pressure equalizing element is disposed in the installation area below the venting channel and glued to the inside of the plug-housing part. The plug-housing part includes, in the installation area, a venting cutout having a first cross section disposed between the pressure equalizing element and a first venting channel. The first venting channel has a second cross section that is smaller than the first cross section and opens up into a second venting channel that runs essentially perpendicular to the first venting channel. The second venting channel is disposed inside a housing projection on an outside of the plug-housing part and has, at each axial end, an opening to the outside.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

In the following description of the preferred embodiments, identical or comparable components are designated with the same reference numerals.

DETAILED DESCRIPTION

In an embodiment, the invention improves the efficiency of the venting through the pressure equalizing element.

For this purpose, according to an embodiment of the invention, a housing for an electronic circuit is provided in which part of the housing is configured as a plug-housing part having an electric plug connector. The pressure equalizing element, which consists of at least one semi-permeable membrane, is arranged on the inside of the plug-housing part below the venting channel. In order to mechanically delimit an installation area for the pressure equalizing element, a web is shaped onto the inside of the plug-housing part. The pressure equalizing element is arranged in this installation area and is glued to the inside or to an adhesion area of the plug-housing part. Inside the installation area, above the pressure equalizing element, there is a venting cutout having a first cross section, and subsequently a first venting channel having a second, smaller cross section. The first venting channel opens up into a second venting channel that runs essentially perpendicular to the first venting channel. A housing projection in which the second venting channel extends is shaped onto the outside of the plug-housing part. The venting channel passes through the housing projection at both of its axial ends, each forming an opening towards the outside.

In comparison to the prior art, the approach according to an embodiment of the invention has the advantage that, on the one hand, the web-like delimitation of the installation area creates a clear-cut and protected installation area for the pressure equalizing element inside the housing. Furthermore, the venting channels are arranged in such a way that they bring about a very advantageous venting effect. For instance, the perpendicular arrangement of the first and second venting channels gives rise to special flow patterns that already create a suction flow in the first venting channel, even when there are only slight air currents passing through the second venting channel.

Preferably, the housing projection is arranged on the outside of the plug-housing part in such a way that it is not situated on a center axis of symmetry of the plug connector. This approach entails the special advantage that this exposed position of the venting channel leads to more favorable flow conditions at the venting channel, thus enhancing the venting process.

It is particularly advantageous for the axial axes of the venting channels to be situated outside of the center axes or axis centers of each venting cutout or venting channel located downstream.

Figure 1:
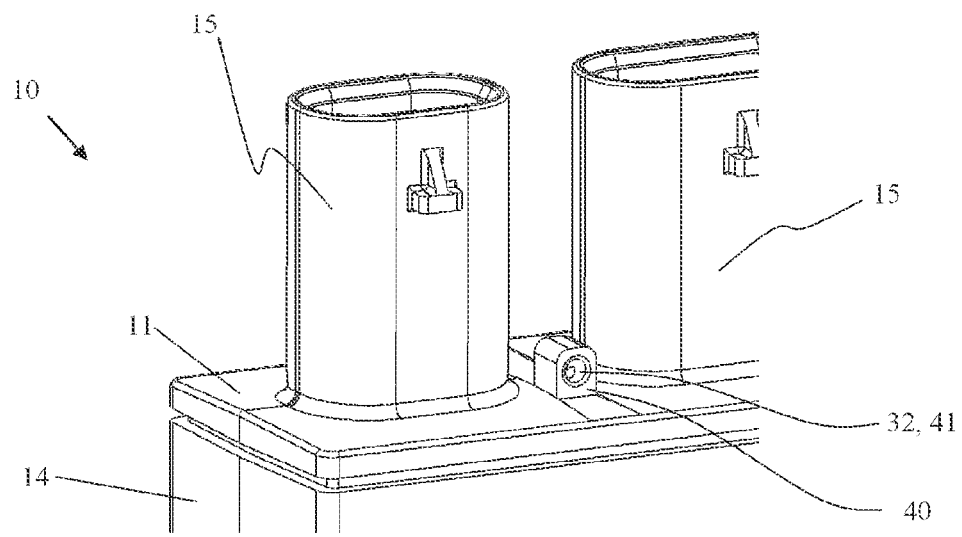
FIG. 1 shows a section of a housing according to an embodiment of the invention.

FIG. 1 shows a perspective view of a housing 10 according to an embodiment of the invention. A plug-housing part 11 with two merely indicated plug connectors 15 is depicted in the upper section. A housing projection 40 with a venting channel 32 is shown in the center between these two plug connectors 15, somewhat offset from the center axis of symmetry of the connectors 15. A base housing 14 that forms a shared housing 10 together with the plug-housing part 11 is merely indicated below the plug-housing part 11.

The arrangement of the housing projection 40 that is offset with respect to the plug connectors 15 entails the advantage that the pressure equalizing element and the housing projection 40 can be taken out of the tight plug area, especially when the installation conditions are tight. This makes it possible, if necessary, to enlarge the pressure equalizing element and the venting channels, thus improving the venting process.

Naturally, a symmetrical arrangement of the housing projection is also conceivable, depending on the application case.

Figure 2:
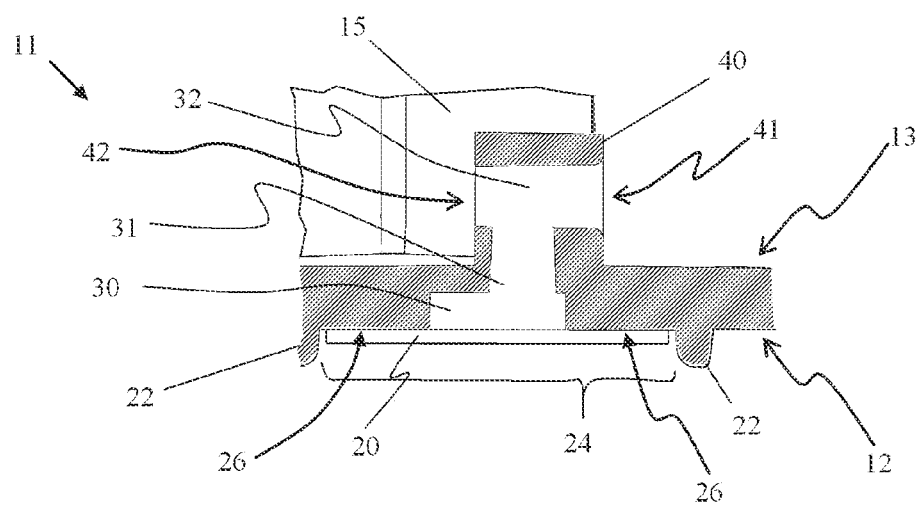
FIG. 2 shows a cross section through a housing according to an embodiment of the invention.

FIG. 2 shows a cross section through the plug-housing part 11 according to an embodiment of the invention as depicted in FIG. 1 along the second venting channel 32 or housing projection 40. The sectional area is indicated by cross-hatching, and a plug connector 15 is merely indicated in the background. An encircling web 22 that surrounds an installation area 24 for a pressure equalizing element 20 is shaped onto the inside 12 of the plug-housing part 11. Inside the web area in the installation area 24, the pressure equalizing element 20 is glued to the inner surface or inside 12 of the plug-housing part 11. A cutout 30 that extends essentially in the center of the installation area is formed inside the installation area 24 above the pressure equalizing element 20. Immediately adjoining the cutout 30 in the direction of the outside 13 is a first venting channel 31 that subsequently opens up into a second venting channel 32 that runs perpendicular thereto. The longitudinal axis of the first venting channel 31 is arranged somewhat outside of the center of the cutout 30. The second venting channel 32 is located in a housing projection 40 that is shaped onto the plug-housing part 11 and that extends outwards above the plane of the outside 13. The second venting channel 32 runs essentially in the center of this housing projection 40, so that the bottom of the second venting channel 32 is arranged slightly above the outside 13 or else so that it runs outwards. The second venting channel 32 passes through the housing projection 40 on two sides, where it forms a first opening 41 and a second opening 42.

This offset or off-centered arrangement of the venting channels has the advantage that the position of the housing projection 40 on the outside 13 can be defined to a certain extent independently of the position of the pressure equalizing element. Of course, a symmetrical or centered arrangement of the venting channels is likewise conceivable.

Figure 3:
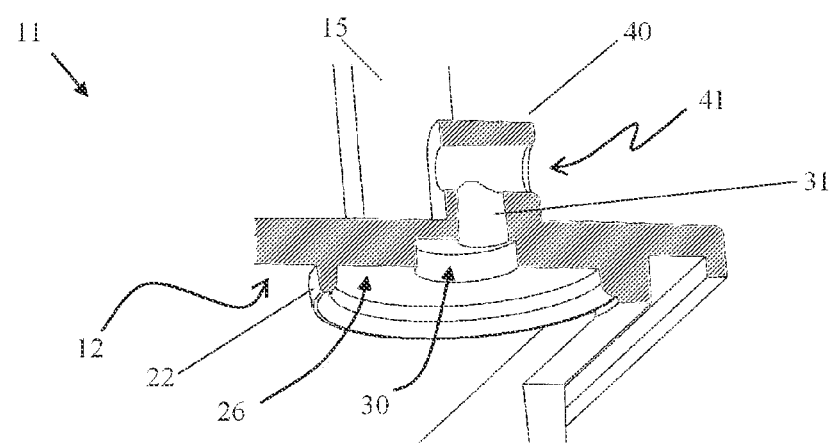
FIG. 3 shows a perspective cross section through a housing according to an embodiment of the invention.

FIG. 3 shows a perspective view of the cross section according to FIG. 2 facing the inside 12 of the plug-housing part 11. The annular shape of the encircling web 22 that delimits the installation surface 24 for the pressure equalizing element 20 can be clearly seen. FIG. 3 does not show the pressure equalizing element 20. The adhesive surface 26 and the venting cutout 30 on the inside 12 are shown.

The housing according to an embodiment of the invention has the advantage that the encircling web marks and delimits an unambiguous position for the pressure equalizing element during the installation procedure. This web especially entails the advantage that the adhesive can be applied very precisely and without detrimentally affecting the surroundings outside of the pressure equalizing element in the area of the adhesive surface 26. Moreover, the web provides a lateral mechanical protection for the pressure equalizing element. The dimensions of the adhesive surface 26 are preferably adapted to an adhesive area provided on the pressure equalizing element.

Furthermore, the design of the venting channels advantageously prevents direct mechanical contact with the pressure equalizing element 20 from the outside. In particular, this has the advantage of providing a greater air-exchange area directly above the pressure equalizing element in the form of the first cutout 30, whereby it is also the case that, especially in order to create a certain jet effect, this cutout tapers to form a first venting channel 1. The jet effect is particularly enhanced by the fact that the second venting channel 32 runs perpendicular to the first venting channel 31. Furthermore, it is advantageous for the second venting channel to run inside the housing projection 40 in such a manner that both openings of the second venting channel run at a distance from the outer surface 13 towards the outside. The configuration of the housing projection 40 on the plug-housing part 11 also has the advantage that the housing projection 40 is protected to a certain extent by the plug connector 15 against mechanical damage, in addition to which this positioning likewise does not interfere with the fastening of the housing.

It goes without saying that other dimensions or orientations of the venting channels are also conceivable. In particular, it is also conceivable for the venting channels to be centered or else to run through the center towards the outside.

The pressure equalizing element is preferably configured as a semi-permeable membrane through which air and water vapor can enter but not water in the liquid state. In another embodiment, it can also be provided that the pressure equalizing element consists of several membrane layers and/or additional support layers or support structures.

Preferably, the housing is made by means of an injection-molding method, preferably employing plastic. Likewise conceivable, however, are versions made of metal.

Preferably, the venting channels and, if applicable, also the cutouts are shaped so as to be conical or beveled in order to simplify the production of the housing, especially by means of injection molding. Such shaping can especially facilitate, for instance, the removal of the injection-molded article from the injection mold.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

LIST OF REFERENCE NUMERALS 10 housing
11 plug-housing part
12 inside
13 outside
14 base housing
15 plug connector
20 pressure equalizing element
22 web
24 installation area
26 adhesive area
30 cutout
31 first venting channel
32 second venting channel
40 housing projection
41, 42 opening

The invention claimed is:

1. A housing for an electronic circuit, comprising:
   a plug-housing part having an electric plug connector, the plug-housing part being configured as a housing having an inside and an outside, a web being shaped onto the inside of the plug-housing part so as to delimit an installation area; and
   a pressure equalizing element disposed in the installation area and glued to the inside of the plug-housing part,
   wherein the plug-housing part includes, in the installation area, a venting cutout having a first cross section disposed between the pressure equalizing element and a first venting channel, the first venting channel having a second cross section that is smaller than the first cross section and opening up into a second venting channel that runs essentially perpendicular to the first venting channel from a first axial end to a second axial end, the second venting channel being disposed inside a housing projection which projects from an outer surface of the plug-housing part so as to be disposed on the outside of the plug-housing part, each of the axial ends of the second venting channel being open and disposed at a distance from the outer surface of the plug-housing part.

2. The housing according to claim 1, wherein the housing projection is disposed on the outside of the plug-housing part away from a center axis of symmetry of the electric plug connector.

3. The housing according to claim 1, wherein one axial axis of the first venting channel is situated outside of a center axis of the venting cutout.

4. The housing according to claim 1, wherein the first venting channel is arranged with respect to the second venting channel such that an axis of the first venting channel intersects an axis of the second venting channel away from a center of the axis of the second venting channel.

* * * * *